United States Patent [19]  
Kane

[11] Patent Number: 4,528,260  
[45] Date of Patent: Jul. 9, 1985

[54] METHOD OF FABRICATING LENTICULAR ARRAYS

[75] Inventor: James Kane, Lawrenceville, N.J.

[73] Assignee: RCA Corporation, Princeton, N.J.

[21] Appl. No.: 489,221

[22] Filed: Apr. 27, 1983

[51] Int. Cl.³ .......................... G03C 5/00; G03B 21/60
[52] U.S. Cl. .................................... 430/321; 430/320; 430/323; 430/324; 430/946; 350/128; 350/167; 354/101; 156/647
[58] Field of Search .................. 430/320, 323, 324, 6, 430/7, 946, 396, 321; 350/128, 167; 354/101; 156/647; 264/1.7

[56] References Cited

U.S. PATENT DOCUMENTS

| Re. 28,385 | 4/1975 | Mayer | 117/201 |
| 3,584,369 | 6/1971 | Montebello | 29/458 |
| 4,318,123 | 3/1982 | Knop | 358/43 |
| 4,350,561 | 9/1982 | Little | 156/624 |

FOREIGN PATENT DOCUMENTS 1276184  6/1972  United Kingdom .

OTHER PUBLICATIONS

Tsang et al., J. Applied Physics, vol. 46, No. 5, May 1975, pp. 2163–2166.
Bassous et al., J. Electrochem. Soc.: Solid State Science and Technology, vol. 125, No. 8, Aug. 1978, pp. 1321–1327.
"Norland Optical Adhesive 61", Norland Products Inc., New Brunswick, N.J. 08902.
"EPO-TEK 301-2", Epoxy Technology Inc., 14 Fortune Dr., P.O. Box 567, Billerica, MA 01821.

Primary Examiner—John E. Kittle
Assistant Examiner—José G. Dees
Attorney, Agent, or Firm—Birgit E. Morris

[57] ABSTRACT

A lenticular array suitable for CCD stripe filters is made by anisotropically etching a V-shaped groove in a 100 silicon wafer wherein the walls of the V-grooves are made by intersecting 111 planes, replicating the V-grooves in metal to form an inverted V-master and spin coating a hardenable resin thereon to form a uniform array of lenses between the peaks.

8 Claims, 9 Drawing Figures

METHOD OF FABRICATING LENTICULAR ARRAYS

This invention relates to a process for making lenticular arrays having an exact and uniform periodicity and a minimum of stray light.

BACKGROUND OF THE INVENTION

A lenticular array is required to image a dichroic stripe filter onto a charge coupled device (hereinafter CCD) chip for CCD cameras. Such a camera is described, for example, in U.S. Pat. No. 4,318,123. The desired periodicity of the array is about 20–100 microns, depending on the design of the CCD chip and the geometry of the dichroic filter associated with the chip, and the focal length is about 0.5 millimeter. The tolerances required are very stringent since the array must image the periodic filter structure exactly onto the periodic CCD chip. Variations in alignment will cause crosstalk and thereby reduce the resolution of the array. The array also must have a minimum of stray light, since stray light impacting the CCD chip limits the ability of the chip to obtain correct green, red, and blue color electronic signals.

Thus ideally the array must have a series of lenses with the exact same contour, and a minimum of area between the lenses which will diffract light.

The manufacture of a durable metal master, which can be used to cast or hot-press a series of plastic lens arrays which can meet these criteria, is very difficult and has not been able to be done on a regular basis using conventional techniques up until now. Thus, I have sought a process which is amenable to mass production but will have the perfection and uniformity desired using state of the art technology.

SUMMARY OF THE INVENTION

The process of the present invention comprises a series of steps whereby a uniform grating having the periodicity required for the lens array is employed as a mask for a 100 silicon wafer. A series of deep V-grooves is anisotropically etched into the wafer using standard photolithographic techniques. A nickel replica is then made of the V-groove grating, which is thus translated into a series of peaks. A curable liquid resin is then spun onto the nickel replica, providing a uniform series of smooth cylindrical lens profiles between each of the peaks. After curing the resin, a nickel mold and replica or stamper can be electroplated thereon to produce a nickel stamper from which uniform lenticular arrays may be formed in plastic.

DETAILED DESCRIPTION OF THE INVENTION

A 100 silicon wafer, in which deep V-grooves are to be etched, is chosen so as to have a wafer flat corresponding to the 110 direction with a deviation of less than 0.5°. The silicon wafer can be of low dopant concentration, either n-type or p-type, free of dislocations. Such high quality silicon wafers are readily available for the semiconductor industry.

The silicon wafers are coated first with a protective coating of silicon dioxide, conveniently about 2,000 Å thick. This coating can be applied by sputtering, but more conveniently is grown by thermal oxidation of the wafer in steam at about 950°–975° C., preferably in the presence of chloride, such as HCl, trichloroethane or trichloroacetylene, to minimize crystallographic damage to the wafer. This process is well known in the semiconductor industry and is described, for example, in U.S. Pat. No. Re. 28,385 to Mayer.

Figure 1:
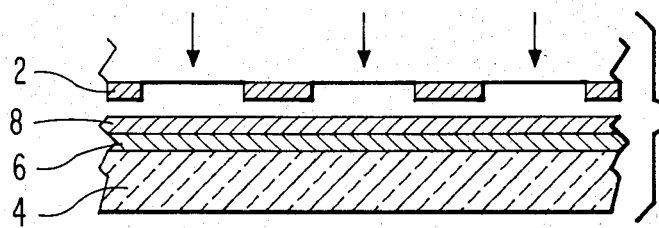
FIGS. 1–9 illustrate a series of steps used to form regular and exact lenticular arrays according to the invention.

The wafer is next coated with a conventional positive photoresist, also as is common in the semiconductor industry. For example, Shipley 1350 photoresist can be employed. The photoresist can be applied from solution as by spinning or dipping the wafer. The wafer is then exposed through a photomask having a uniform grating structure of the periodicity required for the lens array. The space-to-line ratio (aspect ratio) of the grating is determined by the focal length of the lens array desired and is, in general, from about 1:10 to 1:4. The periodicity of the photomask grating determines the periodicity of the lens array. The photomask must be of high quality, free of cosmetic and other defects, since its quality will be reflected in the quality of the lens array mask. Further, the photomask grating must be parallel to the wafer flat to ensure that the grating structure in the wafer is aligned as closely as possible with the 110 crystallographic direction of the silicon substrate. The above arrangement is illustrated in FIG. 1 wherein a photomask grating 2 is placed over a silicon wafer 4 overcoated with a silicon oxide layer 6 and a photoresist layer 8. After exposure, the photoresist layer is developed in accordance with standard techniques, transferring the grating onto the surface of the wafer.

Figure 2:
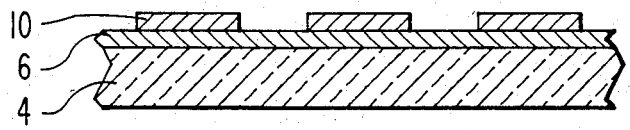

The silicon wafer 4 having the patterned photoresist layer 10 thereon is shown in FIG. 2 and is preferably given a post-bake to harden the photoresist layer 10.

Figure 3:
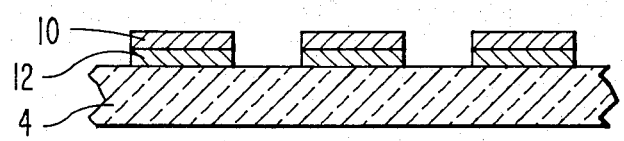

The silicon wafer 4 is then etched to remove the silicon oxide in those areas not protected by photoresist. The patterned silicon oxide layer is shown as layer 12. Either wet etching, using a buffered HF solution, or dry etching, using sputtering or reactive plasma etching techniques, can be employed. Dry etching is preferred since it avoids undercutting of the photoresist layer. This ensures accurate transfer of the photomask pattern into the masking oxide layer. This step is shown in FIG. 3.

Figure 4:
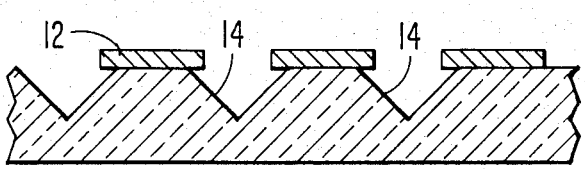

The remaining photoresist is then stripped and the exposed silicon is anisotropically etched so as to form a series of deep V-grooves 14 in the surface of the silicon wafer 4, as shown in FIG. 4.

An anisotropic silicon etch is now employed that will etch silicon much faster in the 100 direction as compared to the 111 direction, and be inert with respect to the masking silicon oxide layer. For example, suitable etchants can be made from 20 parts by weight of KOH in 90 parts of water and 20 parts by volume of isopropanol, employed at 70°–80° C. Another suitable etchant can be made from 17 parts by volume of ethylene diamine, 3 parts by weight of pyrocatechol and 8 parts of water, suitably at about 100° C. These etchant solutions will etch silicon from 50 to 100 times faster in the 100 plane than in the 111 plane. Since the grating has been aligned with the 110 crystal direction, the walls of the V-groove are defined by two 111 crystal planes and the etching is essentially self-limiting with the formation of the V-shaped groove. The bottom of the groove will be extremely sharp since it corresponds to the intersection of two 111 crystal planes. This significantly minimizes the area between lenses of the completed array, and ensures a minimum of stray light from the array.

Figure 5:
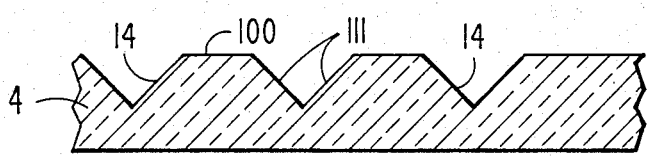

The protective silicon oxide layer 12 is next removed with an HF solution or other suitable etchant, and the wafers are cleaned in conventional manner. The cleaned, etched silicon wafer 4 having V-grooves 14 therein is shown in FIG. 5.

Figure 6:
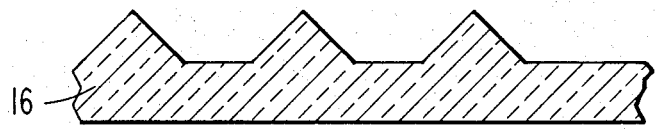

A nickel negative of the silicon wafer is next made. A thin gold coating, suitably about 100–500 Å thick, is applied to the silicon wafer 4, as by evaporation, and a negative nickel master 16 of the grooved silicon substrate is electroformed onto the wafer using a conventional low stress nickel sulfamate plating bath. Plating is continued until a nickel layer thickness of about 100–200 microns is formed. The nickel negative master 16 is illustrated in FIG. 6.

A curable liquid resin 18 is next spun onto the nickel negative master 16 to form a lens-like array. Suitable resins include photoresist or UV or heat curable plastic resins. The surface tension of the liquid resin produces a smooth cylindrical lens profile "hanging" from each of the nickel peaks in the master 16. The focal length of the lenses is dependent on the geometry of the substrate, the viscosity of the liquid, the spin speed and time of application, and the shrinkage properties of the resin. The focal length can be adjusted by varying the spin speed and time of spinning as determined from a series of test runs for a particular resin, as is known. The use of a spun-on liquid resin ensures that the surface of each lens is optically smooth and that the resultant array will have low light scattering. For heat curable resins, a short exposure to temperatures above the melt temperatures of the resin will also smooth the surface of the resin and ensure cylindrical symmetry.

Figure 7:

As an example, HPR 206 photoresist of the Hunt Company was spun onto a nickel negative having peaks about 70 microns high and a periodicity of 107 millimicrons. The liquid was spun on at about 1,000 rpm for 35 seconds and cured by heating in an oven at 160° C. for two hours. Excellent uniformity was achieved. The result is illustrated in FIG. 7. Examples of useful resins include Norland Optical Adhesive 61 of Norland Products Inc., an ultraviolet light curable resin; and EPO-TEK-301-2, an epoxy adhesive, available from Epoxy Technology Inc.

Figure 8:
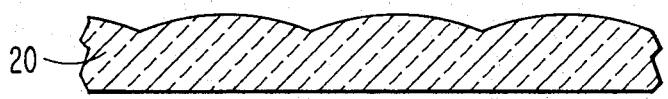
Figure 9:

After the resin has been hardened or cured, a series of nickel electroplating steps is used to produce one or more nickel positive replicas and negative replicas to produce negative metal stampers from which plastic lens arrays may be cast or pressed. These steps are shown in FIGS. 8 and 9 as preparation of a nickel mold 20 and nickel stamper 22. A multiplicity of durable nickel stampers can be made from one mold, as is well known, for example, in the manufacture of audio records.

UV or heat curable resins of optical quality can be used to cast lens arrays onto the nickel stamper, the same or other resins as described hereinabove.

The above process utilizes technology well known in semiconductor manufacture to produce high quality, uniform lens arrays. The quality of the silicon surface and of the initial photomask must be high to achieve good results, but thereafter a plurality of lens arrays, suitable for CCD stripe filters or other applications, can be made rapidly using state of the art processing.

I claim:

1. A process for manufacturing lenticular arrays which comprises
    (a) coating a 100 silicon wafer with a first protective layer of silicon oxide and a layer of photoresist over the oxide layer,
    (b) exposing the photoresist through a photomask having a uniform grating of the desired periodicity of the lens array,
    (c) developing the photoresist and etching through the oxide layer to form a regular series of openings to the silicon substrate,
    (d) anisotropically etching the silicon substrate to form a series of V-grooves with very sharp bottoms in the openings wherein the walls of the grooves intersect along the 111 planes,
    (e) removing the photoresist and oxide layers,
    (f) replicating the V-grooved silicon substrate in nickel to form a series of inverted V-peaks,
    (g) spin-coating a hardenable liquid resin onto the nickel replica to form a series of lenses, and
    (h) hardening the resin thereby forming a lens array having a minimum of area between the lenses.

2. A process according to claim 1 wherein the periodicity of the lens array is from about 20–100 microns.

3. A process according to claim 1 wherein the anisotropic etchant is a solution of potassium hydroxide and isopropanol in water.

4. A process according to claim 1 wherein the anisotropic etchant is a solution of ethylene diamine and pyrocatechol in water.

5. A process according to claim 1 wherein the hardened resin surface is replicated by electroforming a metal mold and then electroforming one or more metal stampers therefrom.

6. A process according to claim 5 wherein a plurality of lenticular arrays are made by casting a hardenable resin onto the metal stamper and hardening the resin.

7. A process according to claim 6 wherein said resin is a photoresist.

8. A process according to claim 6 wherein the resin is a heat or UV curable plastic resin.

* * * * *